(12) United States Patent
Brocard et al.

(10) Patent No.: US 11,353,491 B2
(45) Date of Patent: Jun. 7, 2022

(54) OVERHEAD POWER LINE INSULATOR INCLUDING A LEAKAGE CURRENT MEASUREMENT DEVICE HAVING EXTENDED BATTERY LIFE

(71) Applicant: SEDIVER, Courbevoie (FR)

(72) Inventors: Emmanuel Brocard, Charbonnieres les Varennes (FR); Fabrice Mesples, Bellerive sur Allier (FR); Philippe Carteron, Bellerive sur Allier (FR)

(73) Assignee: SEDIVER, Courbevoie (FR)

( * ) Notice: Subject to any disclaimer, the term of this patent is extended or adjusted under 35 U.S.C. 154(b) by 0 days.

(21) Appl. No.: 17/224,447

(22) Filed: Apr. 7, 2021

(65) Prior Publication Data
US 2021/0325442 A1 Oct. 21, 2021

(30) Foreign Application Priority Data
Apr. 16, 2020 (FR) ...................................... 2003829

(51) Int. Cl.
*H01H 31/12* (2006.01)
*G01R 31/12* (2020.01)
*G01R 31/08* (2020.01)
*H01B 17/00* (2006.01)

(52) U.S. Cl.
CPC ....... *G01R 31/1245* (2013.01); *G01R 31/085* (2013.01); *H01B 17/005* (2013.01)

(58) Field of Classification Search
CPC .... G01R 31/008; G01R 31/085; G01R 31/52; G01R 31/1245; G01R 31/1227; G01R 31/1272; H01B 17/005; H01B 17/02
See application file for complete search history.

(56) References Cited

U.S. PATENT DOCUMENTS

| | | | | |
|---|---|---|---|---|
| 5,973,500 A * | 10/1999 | Moreau | ................ | H02H 1/0015 324/509 |
| 9,535,105 B2 * | 1/2017 | Phillips | .................. | G01R 31/52 |
| 10,254,316 B2 * | 4/2019 | Ball | ................... | G01R 19/2513 |

(Continued)

FOREIGN PATENT DOCUMENTS

| CN | 103558492 A | 2/2014 |
|---|---|---|
| CN | 110261750 A | 9/2019 |

(Continued)

OTHER PUBLICATIONS

French Search Report dated Dec. 7, 2020 issued by INPI in corresponding Application No. FR 2003829, 2 pages.

*Primary Examiner* — Thang X Le
(74) *Attorney, Agent, or Firm* — Ware, Fressola, Maguire & Barber LLP

(57) ABSTRACT

An overhead power line insulator is provided including a device for detecting and measuring a leakage current and for transmitting data, the device being arranged in such a manner as to perform: measuring a leakage current of an insulator during a first measurement period and during a second measurement period in a measurement circuit; comparing two values of the current that are obtained during respective ones of the two measurement periods; and stopping the measurement circuit for a certain sleep period of time if the second value of the current is less than or equal to the first value of the current, and then starting the measurement circuit again after the certain sleep period of time.

10 Claims, 3 Drawing Sheets

(56) References Cited

U.S. PATENT DOCUMENTS

2013/0169285 A1* 7/2013 Phillips ................ G01R 15/186
                                                      324/509
2013/0169286 A1* 7/2013 Phillips ................ G01R 15/14
                                                      324/509

FOREIGN PATENT DOCUMENTS

| EP | 2884292 A1 | 6/2015 |
| FR | 2959066 A1 | 10/2011 |
| FR | 3057697 A1 | 4/2020 |

\* cited by examiner

OVERHEAD POWER LINE INSULATOR INCLUDING A LEAKAGE CURRENT MEASUREMENT DEVICE HAVING EXTENDED BATTERY LIFE

CROSS REFERENCE TO RELATED APPLICATION

This application claims priority under 35 USC § 119 to French Patent Application No. 2003829 filed on Apr. 16, 2020, which is hereby incorporated by reference in its entirety.

TECHNICAL FIELD

The application relates to an electricity line or "power line" insulator including a leakage current measurement device having extended battery life, i.e. an extended period of time for which it can operate as a stand-alone device without action being required to change or recharge its battery.

The application relates more particularly to a power line insulator that includes a leakage current detection and measurement device and that is fastened to a high-voltage overhead power line that is part of an electricity transport or "power transmission" grid, said device being capable of operating as a stand-alone device for a long period of time and of sending measurement results to a remote receiver station.

PRIOR ART

An insulator for overhead power lines is designed to keep a power line in the air on a transmission tower or "pylon", while also providing electrical isolation between the line and the pylon.

Such an insulator is generally in the form of a string of dielectric elements that, during use, are subjected to bad weather, e.g. rain or saline mist, and to air pollution, of natural or industrial origin, so that grains of matter can be deposited on the surfaces of the dielectric elements.

When a layer of dirt becomes moist, it is transformed into a conductive electrolyte, which can give rise to a surface leakage current flowing over the surface of the insulator.

In such a situation, a high leakage current can lead to the electrical isolation being interrupted.

Therefore, power line operators seek to monitor surface leakage currents on this type of installation, so as to take action whenever necessary.

Patent Document EP 2 884 292 discloses a surface leakage current detection device that is equipped with a battery, that continuously measures the leakage current, and that transmits the measurement results to a remote station or to a handheld device, for the purposes of monitoring the insulator.

In order to increase the battery life of that detection device, Patent Document EP 2 884 292 proposes to limit to the strict minimum the quantity of the data transmitted and the complexity of the electronic circuits of the device so as to reduce its power consumption.

Patent document CN 103 558 492 A discloses an overhead power line insulator including a leakage current measurement device and a data transmission device that can be put into sleep mode.

Patent document CN 110 261 750 A discloses an overhead power line insulator including a leakage current measurement device and a data transmission device that can be activated when specific events are detected.

SUMMARY OF THE INVENTION

In accordance with the present application, an overhead power line insulator is provided that includes a leakage current detection device that is situated on a pylon or tower in the vicinity of conductors under high voltage, and can be accessible only rarely.

An object of the present application is to reduce the frequency of maintenance that is necessary for proper operation of such an insulator, while also maintaining the quality of the monitoring.

To this end, the present application provides an overhead power line insulator including a device for detecting a leakage current and for transmitting data, which device is suitable for detecting and measuring a leakage current of the insulator, for recording values of a measured current in a computer memory, and for transmitting data representative of said values to a station that is remote from the insulator, the device being arranged in such a manner as to perform the following steps: measuring a leakage current of the insulator during a first measurement period in a measurement circuit, and recording a first value corresponding to a maximum magnitude of the measured leakage current in a memory; measuring said leakage current during a second measurement period following the first measurement period in a measurement circuit, and recording a second value corresponding to a maximum magnitude of the measured leakage current in a memory; comparing the first value of the current with the second value of the current; and stopping said measurement circuit for a certain sleep period of time if the second value of the current is less than or equal to the first value of the current, and then starting said measurement circuit again after said certain sleep period of time.

The device for detecting leakage currents of the insulator of the application is arranged to manage its behavior in event-based manner, i.e. taking account of the variation in the measured leakage current.

More specifically, measuring the leakage current is stopped when the measured leakage current is stable or is decreasing from one measurement period to another, thereby improving the relevance of the measurements taken, and leading to power saving, and thus to lengthening of the battery life of the insulator.

The device of the present application may have the following features:

the insulator may further include a hygrometer, and be arranged to compute said sleep period of time as a function of a relative humidity level measured by the hygrometer;

the insulator may be arranged in such a manner that the leakage current is measured only if the device detects a leakage current of magnitude greater than at least one prerecorded threshold current;

the device may be arranged in such a manner that the leakage current is measured if the device detects a leakage current of magnitude lying in the range extending from a first prerecorded threshold current to a second prerecorded threshold current that is greater than the first prerecorded threshold current, and only if an average of the values of the measured current is less than said second threshold current; and the insulator is arranged in such a manner as to transmit data representative of the values of the measured current, of extrema, and of an average value of the values of the measured current, as well as a count value counting the number of the values of the measured current.

Thus, the insulator of the application is arranged in such a manner as to launch a leakage current measurement as a function of the outside conditions (relative humidity) and of the present and past magnitudes (average, magnitude) of the leakage current, automatically adapting to circumstances to take relevant measurements avoiding continuous and high power consumption operation, which would reduce its battery life.

BRIEF DESCRIPTION OF THE FIGURES

The present invention can be better understood and other advantages appear on reading the following detailed description of the embodiment given by way of non-limiting example and with reference to the accompanying drawings, which are described briefly as follows.

DESCRIPTION OF AN EMBODIMENT OF THE DEVICE OF THE INVENTION

This embodiment is shown in FIGS. 1 to 5.

Figure 1:
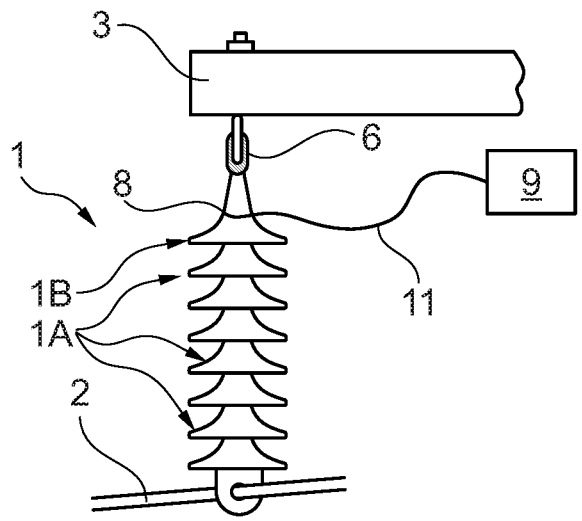
FIG. 1 is a diagram of an insulator of the present application, as equipped with an electronic device for detecting and measuring leakage current and for transmitting data.

FIG. 1 is a diagram of the insulator 1 for overhead lines 2, the insulator including a device 10 for detecting a leakage current of the insulator, for measuring said current, and for transmitting data representative of the measured leakage current, which device comprises an electronic module 9 and a conductor element 8 for capturing the leakage current, which conductor has, in this example, the shape of a metal ring arranged in such a manner as to surround an insulating section of the insulator 1, as shown.

The insulator 1 in this particular embodiment is formed of a string of dielectric elements 1A and 1B, and is designed to suspend the overhead power line such as a high-voltage line in the air from a tower or pylon 3.

In such an insulator, the dielectric elements may be made of tempered or "quenched" glass, as described in Patent Document FR 3 057 697.

Figure 2:
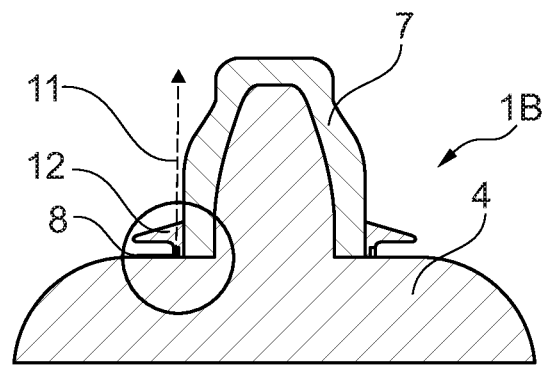
FIG. 2 is an enlargement of the dielectric element of the top end of the insulator of FIG. 1.

The dielectric element 1B, situated at the top end of the insulator 1, receives the conductor element 8 and is equipped with a protective element 12 that can be seen in FIG. 2 and that protects the conductor element 8 from bad weather in the manner of an umbrella.

In this example, the conductor element 8 is an electrically conductive metal ring that is fitted coaxially to the outside surface 4 of the dielectric element 1B in such a manner as to intercept the surface leakage current that flows over its surface towards the attachment fitting 6 forming the interface between the insulator 1 and the system for suspension from the pylon.

In this example, the conductor element 8 is of square section, but it could also be of rectangular or similar section, or of any other section.

In this example, the conductor element 8 has a flat annular base that is directly in contact with the outside surface 4 of the dielectric element 1B.

The conductor element 8 may be adhesively bonded to the outside surface 4 while guaranteeing electrical conduction by means, for example, of an epoxy adhesive filled with silver or with copper.

Independently of its type, of its geometrical shape, and of its mode of fastening to the insulator 1, the conductor element 8 is designed and mounted on the insulator 1 in a manner such as to intercept preferably as a large a proportion as possible of the leakage current, or optionally the leakage current in its totality.

The magnitude of the leakage current normally takes values lying in the range a few milliamps to a few hundred milliamps.

The term "magnitude of the leakage current" is used to mean an absolute value, since this current may be a direct current or an alternating current.

An electrical cable 11 connects the conductor element 8 for capturing the leakage current to the electronic module, optionally by passing through the protective element 12 and then running along the attachment fitting 6.

Although not shown, another electrical cable connects the electronic module 9 to electrical ground in order to transport thereto the leakage current captured by the conductor element 8.

Alternatively to the above-described insulator, the insulator of the present application could have a composite structure, such as the structure described in Patent Document FR 3 057 697.

In any event, the device is not limited to one particular type of insulator or to one particular type of connection to the electronic module.

Figure 3:
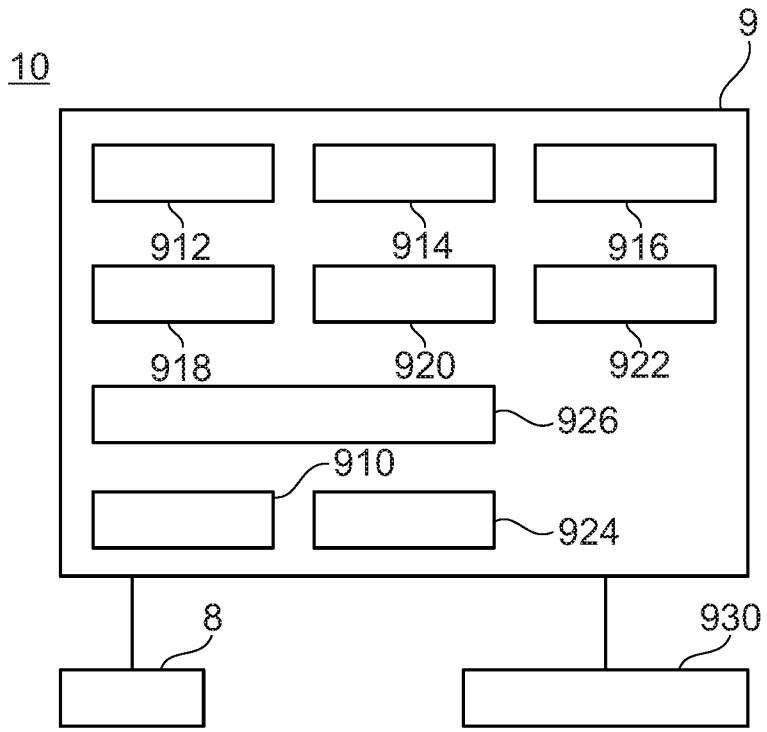
FIG. 3 is a block diagram of the electronic device of FIG. 1.

As shown in FIG. 3, the electronic module 9 of the device 10 comprises: a measurement circuit 910 designed to measure the currents coming from the conductor element 8; a computer 912 designed to perform computations on the data acquired by the measurement circuit; a computer memory 914 designed to store the measurement results of the measurement circuit and the results of the computations by the computer; a communications system 916 designed to transmit the results of the computations by the computer and data stored in the computer memory to a remote receiver station; a clock 918, a hygrometer 920; a thermometer 922; and a rechargeable battery or a non-rechargeable battery 924 designed to power the module.

The elements comprising the electronic device may be in the form of separate elements that are connected together by electrical cables, or be integrated in full or in part into a set or assembly such as a printed circuit.

Power-generating equipment 930 such as a solar panel and/or a wind turbine may be arranged to power the electronic device in parallel with the non-rechargeable battery and/or to recharge the rechargeable battery.

It is understood that the elements of FIG. 3 are interconnected in a conventional manner, e.g. in such a manner that the equipment 930 and/or the rechargeable battery or non-rechargeable battery 924 power the other elements, and that the thermometer and the hygrometer deliver data to the computer and/or to the memory in a form that is usable by them.

Figure 4:
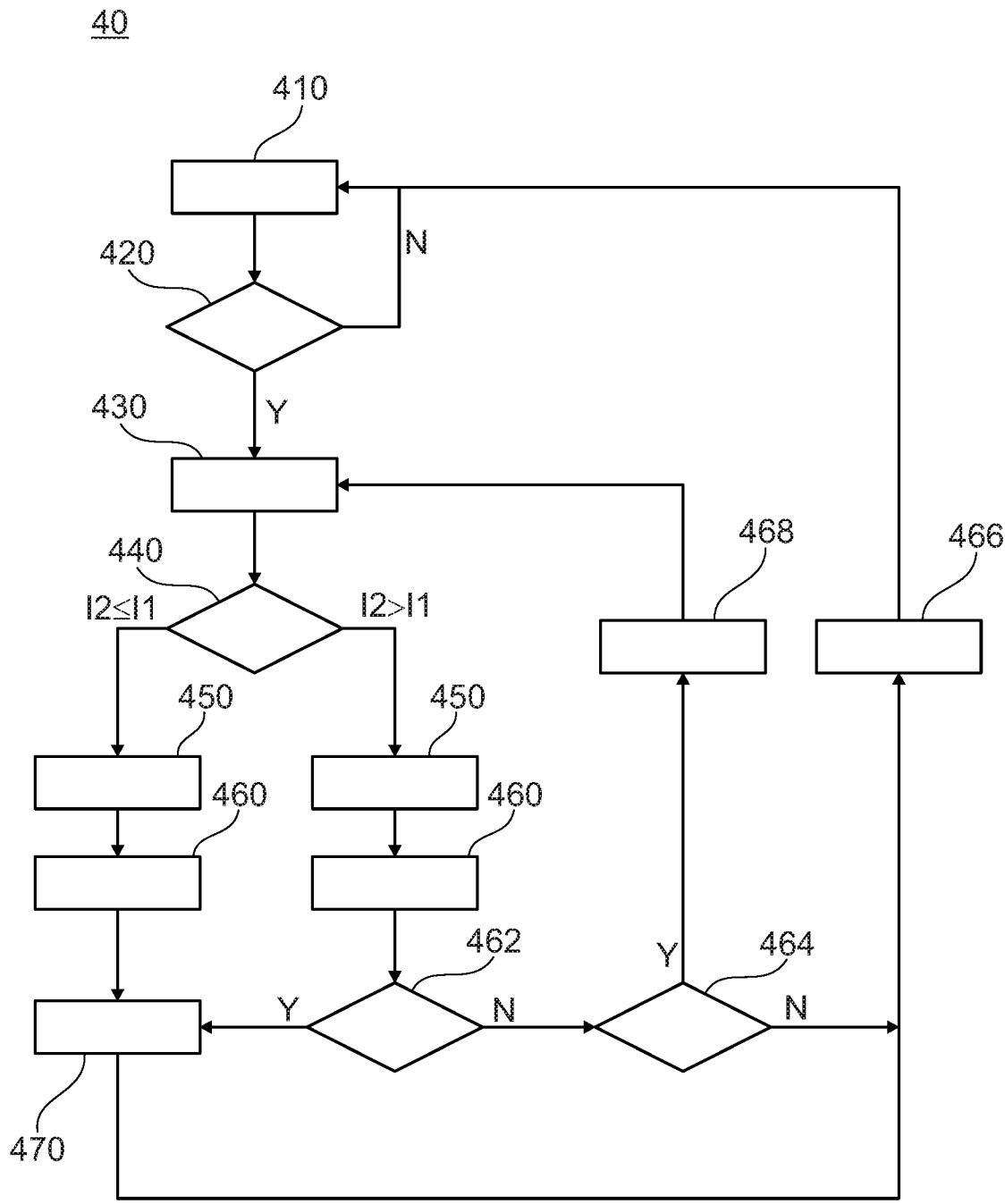
FIG. 4 is a flow chart showing how the insulator of FIG. 1 operates.

In order to save the battery and in order to increase its life without sacrificing the relevance of the measurements taken, the insulator is arranged in a manner such as to operate as follows, and as shown in the flow chart 40 of FIG. 4.

Inside the electronic module 9, the device 10 includes a detection circuit 926 that is arranged in such a manner as to compare the value of the leakage current of the insulator that is flowing through the conductor element 8 for capturing leakage current with one or more threshold currents in order to detect when said thresholds are exceeded by the leakage current.

The device 10 is designed in such a manner that, while it is in use, its default mode is a standby or "power-saving" mode that it maintains during a step 410, the standby mode being an operating mode involving only a low power consumption by the electronic elements of the device.

Conversely, the device 10 is designed to go into a measurement mode during a step 430 if the detection circuit 926 detects (Y) that the leakage current exceeds a given threshold current $I_{threshold}$ during a test step 420, by comparing the leakage current with the given threshold current.

Such a threshold current is non-zero, and may be prerecorded, in digital form in a computer memory such as the memory 914 or in the form of a set of electronic elements integrated into a circuit such as the detection circuit 926.

When the device is in measurement mode during the step 430, the measurement circuit takes measurements of the leakage current during a measurement cycle constituted by two successive measurement periods, namely a first measurement period and a second measurement period immediately following the first measurement period.

Each of the measurement periods may last a few tens of milliseconds (ms), it being possible, for example, for the measurement mode to be maintained at 160 ms, with a first measurement period and a second measurement period of 80 ms each.

The measurement circuit 910, such as an electronic card for measurement and/or data acquisition, measures and records in a first table stored in the computer memory 914 the maximum value for the measured leakage current flowing through the conductor element during each of the two measurement periods: the first maximum value of the current I1 during the first measurement period and the second maximum value of the current I2 during the second measurement period.

The first table is typically a table of two values, each dedicated to one of the two measurement periods.

The computer compares the two maximum values of the current with each other during a test step 440 at the end of the second measurement period.

The device 10 is arranged to respond to the comparison by the computer by going into a sleep mode for a sleep period of time, i.e. by stopping the measurement circuit by cutting it off from its power source or by any other means for the sleep period of time during a step 470, on condition that the second maximum value of the current is less than or equal to the first maximum value of the current (I2≤I1), then by going back into standby mode after the sleep period of time, i.e. by starting the measurement circuit again, e.g. by re-establishing its power supply, thereby returning to step 410.

In this situation, the current is evaluated as being constant or decreasing and it is considered that monitoring the leakage current continuously and keeping the measurement circuit ready to react immediately in the event of the threshold current being exceeded by the leakage current is not necessary, and that it is possible to stop the circuit for a certain period of time known as the "sleep period of time".

In response to the comparison, when the second maximum value of the current is greater than the first maximum value of the current (I2>I1), the device 10 is arranged to remain in measurement mode, thereby returning to step 430.

In this situation, the leakage current is considered as being increasing, and it is considered that it is relevant to keep measurement of it by the measurement circuit active.

It is possible to improve the relevance of the measurements further by imposing conditions on maintaining the measurement mode by means of the following two test steps.

A first test step 462 consists in comparing the state of a counter indicating the number of measurement cycles performed consecutively, i.e. without going via the standby mode, with a threshold number $N_{threshold}$.

Going into the sleep mode of step 470 is imposed before returning to the standby mode of step 410 when the counter reaches (Y) said threshold number, e.g. 10.

In this case, the counter is reset during a reset step 466.

So long as the counter does not reach (N) the threshold number $N_{threshold}$, a second test step 464 is applied, comparing the two maximum values of the current I1 and I2 with said given threshold current $I_{threshold}$, going into the standby mode of step 410 being imposed when neither of the values of the two currents measured is greater (N) than said threshold current.

In this situation too, the counter is reset during a reset step 466.

When the computer does not reach (N) the threshold number $N_{threshold}$ and when at least one of the two values I1 and I2 is greater than or equal (Y) to said given threshold current $I_{threshold}$, the device is brought back to step 430 to keep the device in measurement mode and to launch a measurement cycle again.

In this situation, the counter is incremented by 1 during a step 468 for monitoring the number of measurement cycles performed consecutively.

In sleep mode, the measurement circuit is stopped and cannot therefore take any measurement, even if the detection circuit 926 detects that the threshold current has been exceeded.

This is the operating mode of the device that saves the most power due to the measurement circuit being stopped.

Using this mode thus enables a substantial power saving to be made and thus enables the battery life of the device 10 to be increased.

In standby mode, the measurement circuit is powered and is ready to respond to an instruction to go into measurement mode and take measurements.

In measurement mode, the measurement circuit is active, i.e. it is powered, and, in addition, takes measurements of the leakage current, thereby leading to the device 10 consuming substantially more power than in the other modes.

Thus, in the insulator, the leakage current is measured only if the device detects a leakage current of magnitude greater than a given threshold.

The device, arranged to implement the above-described method of deciding whether to enter the measurement mode, offers an excellent balance between battery life and level of monitoring of the leakage current: the battery life is increased by putting the measurement circuit to sleep when continuous monitoring of the leakage current does not appear necessary, but the measurement is maintained when the probability of the leakage current exceeding a threshold current appears high, in view of the variation in the leakage current.

It is possible to set a default period of time for the sleep period of time at, typically, a few minutes, e.g. 2 minutes.

It is also possible to optimize the balance between battery life and monitoring by using the measurement results of the hygrometer: a low relative humidity level leads to a decrease in the risk of a leakage current being sufficiently high to lead to going into measurement mode.

The device 10 may thus be arranged to use the computer to compute said sleep period of time as a function of the relative humidity level measured by the hygrometer, and more specifically to increase the sleep period of time when the relative humidity level is low, e.g. by going from the default setting of 2 minutes to 4 minutes when the relative humidity is measured by the hygrometer as being less than 50%.

In any event, at the end of the two measurement periods of the measurement mode, the highest maximum value of the current that is stored in the first table is recorded in a second table of the computer memory 914 during a step 450 and the first table is reinitialized during a step 460.

The second table has a capacity limited to a few hundred values, e.g. 500.

If the number of measurement cycles performed leads to the number of values that can be recorded in the second table being exceeded, a new value to be recorded replaces a previously recorded lower value when such a value exists, or else the new value is not recorded when it is less than all of the values filling the second table.

Figure 5:
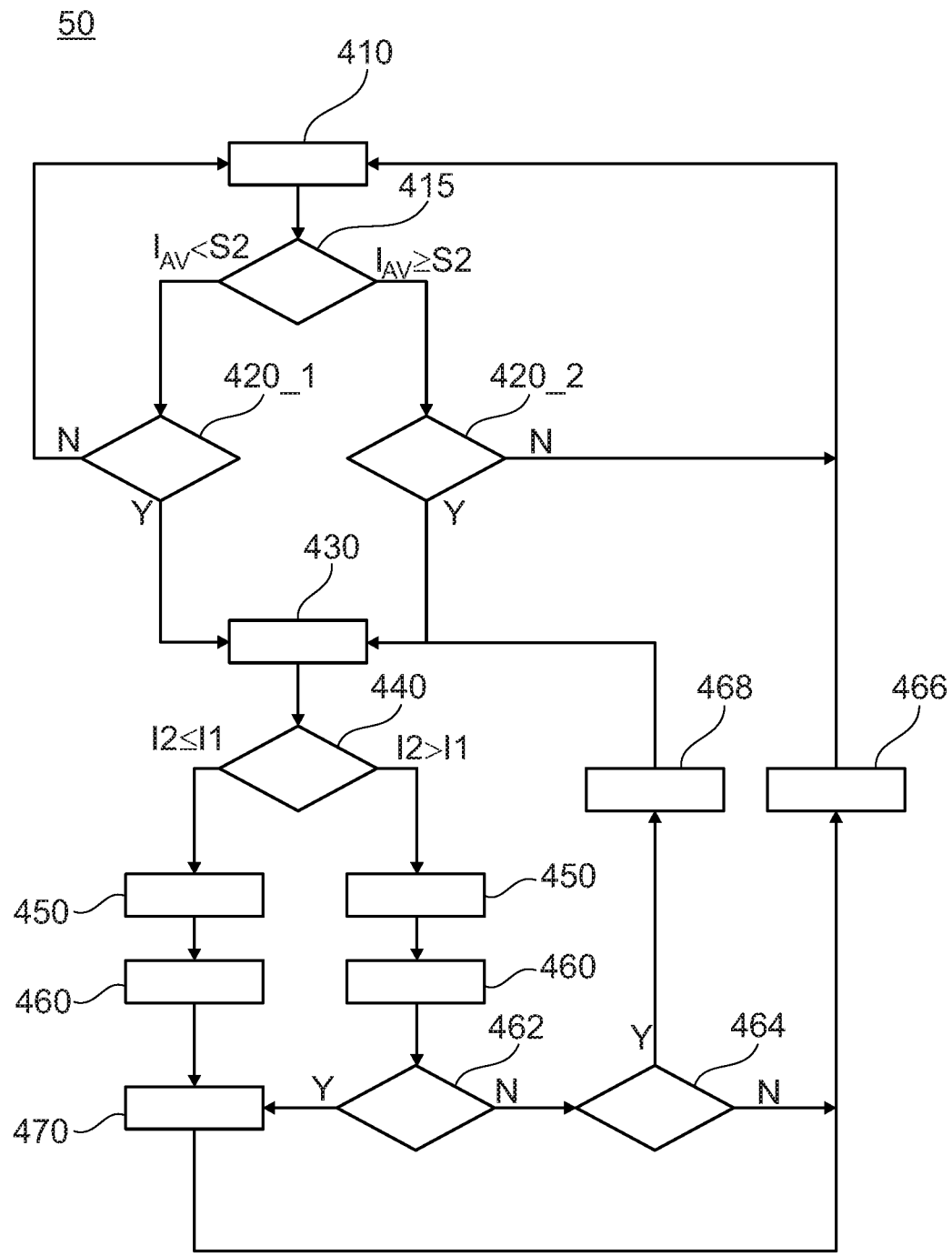
FIG. 5 shows a variation in the flow chart of FIG. 4.

In order to further increase the battery life of the current measurement device, it is also possible to set the threshold current as from which the device goes into measurement mode, i.e. as from which the current measurements are triggered, as a function of the measurements already taken, as shown in the flow chart 50 of FIG. 5.

The description below focuses on the steps that are different from the steps of flow chart 40, and it is possible to refer to that flow chart and to the corresponding explanations for the steps having the same identifiers.

Thus, the detection circuit 926 may be arranged in such a manner as to compare the current flowing through the conductor element 8 with different threshold currents from the history of the device, which history is represented by the values recorded in the second table.

For example, the detection circuit 926 may comprise two detection sub-circuits that are of similar design but that are arranged to detect the leakage current exceeding respective threshold currents, each of the threshold currents being prerecorded as described above in detail for step 420.

Thus, it is possible to provide two threshold currents, namely a first prerecorded threshold current S1 and a second prerecorded threshold current S2 that is greater than the first prerecorded threshold current, and to use the first threshold current S1 as the default setting, which is then considered to be the active threshold current, while the second threshold current S2 remains passive.

In this description, saying that a threshold current is "active" means that it is the reference value used by the detection module 926 to detect the leakage current exceeding a threshold current.

Conversely, saying that a threshold current is "passive" means that it is not used by the detection module 926.

After each measurement mode, it is possible to compare the active threshold with the average of the values stored in the second table during a test step 415 as indicated by the flow chart 50 of FIG. 5, and to define the first threshold current S1 as active and the second threshold current S2 as passive if the average of the values recorded in the second table is less than the second threshold current S2.

In this manner, if the average $I_{AV}$ of the values stored in the second table is less than the second threshold current S2 ($I_{AV}<S2$), then the device will go into measurement mode if the leakage current is detected as exceeding the first threshold current (Y) during a test step 420_1, using the principle of step 420.

Conversely, if the average $I_{AV}$ of the values stored in the second table is greater than or equal to the second threshold current S2 ($I_{AV} \geq S2$), then it is possible to define the first threshold current S1 as passive and the second threshold current S2 as active, and the device will go into measurement mode if the leakage current is detected as exceeding the second threshold current (Y) during a test step 420_2, using the principle of step 420.

To sum up, the insulator of the present application is arranged in such a manner that the leakage current is measured in the event that the device detects a leakage current of magnitude lying the range extending from a first threshold current S1 to a second threshold current S2 that is greater than the first threshold current only if an average of preceding values of measured leakage current is less than said second threshold current, detection of the second threshold current being exceeded by the leakage current systematically resulting in going into measurement mode.

By proceeding in this way, and in a situation in which a leakage current is generally high, the occurrences of a threshold current being exceeded by the largest amounts are always measured and recorded, but the device does not go into measurement mode for occurrences of a threshold current being exceeded by amounts that are considered to be normal or negligible in view of the history represented by the second table.

The first threshold current may be determined in such a manner as to be situated above the measurement noise, so as to consider only the currents that can be detected and measured reliably.

The second threshold current may be defined on the basis of the experience of the manager or operator of the power line that is monitored by means of the insulator described herein and on the basis of the ordinarily measured leakage currents.

From a practical point of view, it is thus possible, for example, to assign the values of 20 milliamps (mA) and 150 mA respectively to the first threshold current and to the second threshold current.

The above-described processing and transmission of the values of measured leakage current makes it possible to limit the number of times the device goes into measurement mode, as well as, optionally, to limit the quantity of data to be transferred to the remote station, while also acquiring and transferring the relevant data, on the basis of an event-based evaluation of the leakage current of the insulator rather than on continuous monitoring of said leakage current.

Periodically, the values stored in the second table, corresponding to extrema of the measured leakage current, their average and their number are transmitted to a receiver station that is remote from the insulator by means of the communications system 916 and the second table is reinitialized.

Furthermore, the maximum value of the second table, the outside temperature, the relative humidity, the voltage of the rechargeable battery or of the non-rechargeable battery, the number of times the leakage current is detected as exceeding the first threshold current, the number of times the leakage current is detected as exceeding the second threshold current and, where applicable, the voltage across the terminals of a solar panel may be transmitted to the remote station for better evaluating the leakage current, the surrounding environment in which the monitored insulator is situated, and the state of said monitored insulator.

The numbers of measurements or of times the leakage current exceeds a threshold current are obtained by respective count values by means of counting performed by the computer.

The device may be arranged in such a manner as to proceed with such transmission, typically, every hour, thereby securing good reactivity by the operator receiving the data, without requiring the device to consume excessive power.

Naturally, the present invention is in no way limited to the above-described embodiment, which can undergo modifications without going beyond the ambit of the invention.

The invention claimed is:

1. An overhead power line insulator comprising a device for detecting a leakage current and for transmitting data, wherein the device is suitable for detecting and measuring a leakage current of the insulator, for recording values of a measured current in a computer memory, for transmitting data representative of said values to a station that is remote from the insulator, the device being configured to:
   measure the leakage current of the insulator during a first measurement period in a measurement circuit, and record a first value corresponding to a maximum magnitude of the measured leakage current in the computer memory; and
   measure said leakage current during a second measurement period following the first measurement period in the measurement circuit, and record a second value corresponding to a maximum magnitude of the measured leakage current in the computer memory;
   compare the first value with the second value; and
   stop said measurement circuit for a certain sleep period of time if the second value of the leakage current is less than or equal to the first value of the leakage current, and then starting said measurement circuit again after said certain sleep period of time.

2. An insulator according to claim 1, wherein the device further includes a hygrometer, and is arranged to compute said certain sleep period of time as a function of a relative humidity level measured by the hygrometer.

3. An insulator according to claim 1, wherein the leakage current of the insulator is measured only if the device detects a leakage current of the insulator of magnitude greater than at least one prerecorded threshold current.

4. An insulator according to claim 1, wherein the leakage current of the insulator is measured if the device detects a leakage current of the insulator of magnitude lying in a range extending from a first prerecorded threshold current to a second prerecorded threshold current that is greater than the first prerecorded threshold current, and only if an average of values of the measured leakage current is less than said second prerecorded threshold current.

5. An insulator according to claim 1, wherein the device is configured to transmit data representative of the values of the measured current, of extrema, and of an average value of the values of the measured current, as well as a count value counting the number of measured values of the leakage current.

6. An insulator according to claim 2, wherein the leakage current of the insulator is measured only if the device detects a leakage current of the insulator of magnitude greater than at least one prerecorded threshold current.

7. An insulator according to claim 2, wherein the leakage current of the insulator is measured if the device detects a leakage current of the insulator of magnitude lying in a range extending from a first prerecorded threshold current to a second prerecorded threshold current that is greater than the first prerecorded threshold current, and only if an average of values of the measured leakage current is less than said second prerecorded threshold current.

8. An insulator according to claim 2, wherein the device is configured to transmit data representative of the values of the measured current, of extrema, and of an average value of the values of the measured current, as well as a count value counting the number of measured values of the leakage current.

9. An insulator according to claim 3, wherein the device is configured to transmit data representative of the values of the measured current, of extrema, and of an average value of the values of the measured current, as well as a count value counting the number of measured values of the leakage current.

10. An insulator according to claim 4, wherein the device is configured to transmit data representative of the values of the measured current, of extrema, and of an average value of the values of the measured current, as well as a count value counting the number of measured values of the leakage current.

* * * * *